United States Patent
Sasaki

(10) Patent No.: US 6,780,697 B2
(45) Date of Patent: Aug. 24, 2004

(54) METHOD OF MANUFACTURING LATERAL DOUBLE-DIFFUSED METAL OXIDE SEMICONDUCTOR DEVICE

(75) Inventor: Katsuhito Sasaki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/052,244

(22) Filed: Jan. 23, 2002

(65) Prior Publication Data

US 2003/0040159 A1 Feb. 27, 2003

(30) Foreign Application Priority Data

Aug. 21, 2001 (JP) ........................................ 2001-250752

(51) Int. Cl.[7] ............................................. H01L 21/336
(52) U.S. Cl. .................... 438/217; 438/276; 438/289; 438/305; 438/306; 438/517; 438/527; 438/530; 438/542; 438/770
(58) Field of Search .............................. 438/217, 227, 438/228, 276, 289, 517, 527, 530, 532, 542, 585, 770, FOR 428, FOR 494, 301, 302, 303, 304, 305, 306, 307, 920, FOR 188

(56) References Cited

U.S. PATENT DOCUMENTS

| | | | | |
|---|---|---|---|---|
| 4,928,155 A | * | 5/1990 | Nakagawa et al. | |
| 5,304,827 A | * | 4/1994 | Malhi et al. | |
| 5,382,536 A | * | 1/1995 | Malhi et al. | |
| 5,736,766 A | * | 4/1998 | Efland et al. | ............... 257/338 |
| 5,777,365 A | * | 7/1998 | Yamaguchi et al. | |
| 5,812,006 A | * | 9/1998 | Teggatz et al. | |
| 5,859,456 A | * | 1/1999 | Efland et al. | |
| 5,905,288 A | * | 5/1999 | Ker | |
| 5,925,900 A | * | 7/1999 | Amaratunga et al. | |
| 6,137,140 A | * | 10/2000 | Efland et al. | |
| 6,172,401 B1 | * | 1/2001 | Brand | |
| 6,420,281 B2 | * | 7/2002 | Okuno et al. | |
| 6,424,005 B1 | * | 7/2002 | Tsai et al. | |
| 6,426,258 B1 | * | 7/2002 | Harada et al. | ............... 438/268 |
| 6,528,375 B2 | * | 3/2003 | Gregory | ............... 438/302 |

FOREIGN PATENT DOCUMENTS

| | | | |
|---|---|---|---|
| EP | 0 880 183 A2 | * | 11/1998 |
| JP | 10-335663 | | 12/1998 |

\* cited by examiner

*Primary Examiner*—George Fourson
*Assistant Examiner*—Joannie Adelle Garcia
(74) *Attorney, Agent, or Firm*—Volentine Francos, PLLC

(57) ABSTRACT

A method of manufacturing an LDMOS transistor includes providing a semiconductor substrate of a first conductivity type having a well region of a second conductivity type formed on a surface of the substrate. Ions of the first conductivity type are implanted into a part of the well region with a predetermined energy. The substrate is subjected to a heat treatment so that the implanted ions are diffused to form a diffusion region of the first conductivity type on the surface of the substrate. Then, a gate oxide layer and a gate electrode are formed on the surface of the substrate. Finally, a drain region is formed on the surface of the substrate. The predetermined energy for the implantation is set so that an accelerated oxidation during a formation of the gate oxide layer is inhibited.

16 Claims, 2 Drawing Sheets

US 6,780,697 B2

METHOD OF MANUFACTURING LATERAL DOUBLE-DIFFUSED METAL OXIDE SEMICONDUCTOR DEVICE

BACKGROUND OF THE INVENTION

The present invention relates to a manufacturing method of an LDMOS transistor in which an ion-implantation process can be omitted.

A lateral double-diffused metal oxide semiconductor (LDMOS) is known as a small-sized power device having a small power consumption, and a structure and manufacturing method of the semiconductor are disclosed, for example, in Japanese Patent Application Laid-Open No. 1998-335663. In general, there are N-type and P-type LDMOSs. Here, a manufacturing method of a conventional LDMOS will be described hereinafter in terms of an example of the N-type.

Respective techniques such as oxidation, photolithography, and impurity implantation are used to implant N-type impurities such as phosphorus (P) into a predetermined region on a P-type semiconductor substrate. Subsequently, a diffusion technique is used to form an N-type well as a drain. Subsequently, techniques such as photolithography and ion-implantation are used to implant P-type impurities such as boron (B) forming a D well of the LDMOS into the N-type well, then the same resist is used to implant the N-type impurities such as arsenic (As), and the diffusion technique is used to form a P-type diffusion layer forming the D well and an N-type diffusion layer forming a source. Here, since boron (B) is a small element and has a large diffusion coefficient as compared with arsenic (As), the P-type diffusion layer is formed to be deeper than the N-type diffusion layer.

Subsequently, a LOCOS forming technique is used to form a field oxide film for isolating elements from one another, an oxidation technique is used to form a gate oxide film on an inner surface of the field oxide film, and respective techniques such as known CVD, photolithography, and etching are used to form a polysilicon electrode in a channel forming region on the gate oxide film so that the electrode extends over the N-type well, P-type diffusion layer forming the D well, and N-type diffusion layer.

Subsequently, the photolithography technique is used to perform a desired patterning, and the resist and gate electrode are used as masks to implant the N-type impurities such as phosphorus (P) into the surface in the N-type well. Moreover, the diffusion technique is used to form the N-type diffusion layer forming a reduced surface drain (RSD) in the N-type well on a region having no P-type diffusion layer forming the D well.

Subsequently, the photolithography and implantation techniques are used to implant the N-type impurities such as arsenic (As) in a region as a part of the N-type diffusion layer from which electrodes of a drain and source are extracted, and implant the P-type impurities such as boron (B) in a region from which the electrode of the D well is extracted. Furthermore, the diffusion technique is used to form the N-type and P-type diffusion layers, and finally the LDMOS is formed through contact formation, and wiring formation.

For the LDMOS formed by the aforementioned conventional method, after the N-type diffusion layer forming the source is formed, the gate oxide film is formed. Therefore, the gate oxide film on the N-type diffusion layer forming the source is formed to be thicker than the gate oxide film on the D well by accelerated oxidation. In this manner, a stepped portion is formed in a boundary having a difference in thickness in the gate oxide film in this manner. Therefore, an electric field distribution in the gate oxide film is not uniform, and there is uncertainty in reliability of pressure resistance of the gate oxide film.

SUMMARY OF THE INVENTION

The present invention may solve the aforementioned prior-art problem and provide a highly reliable semiconductor device. In the device, an accelerated oxidation during formation of a gate oxide film could be suppressed. Further, a stepped portion of the gate oxide film on a D well may be reduced.

A method of manufacturing an LDMOS transistor of the present invention comprises providing a semiconductor substrate of a first conductivity type having a well region of a second conductivity type formed on a surface of the substrate. Ions of the first conductivity type are implanted into a part of the well region with a predetermined energy. The substrate is subjected to a heat treatment so that the implanted ions are diffused to form a diffusion region of the first conductivity type on the surface of the substrate. Then, a gate oxide layer and a gate electrode are formed on the surface of the substrate. Finally, a drain region is formed on the surface of the substrate. The predetermined energy for the implantation is set so that an accelerated oxidation during a formation of the gate oxide layer is inhibited.

DETAILED DESCRIPTION OF THE PREFERRED EMBODIMENTS

Figure 1A:
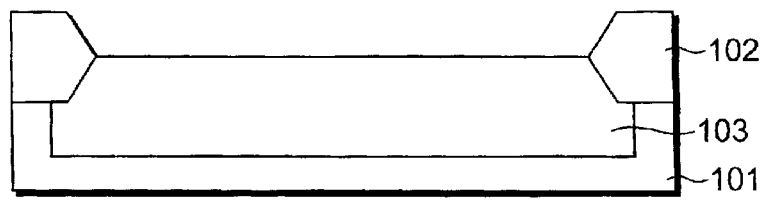
FIGS. 1(A) to 1(F) are transverse sectional front views showing a manufacturing process of an LDMOS transistor according to a first embodiment of the present invention.
Figure 1B:
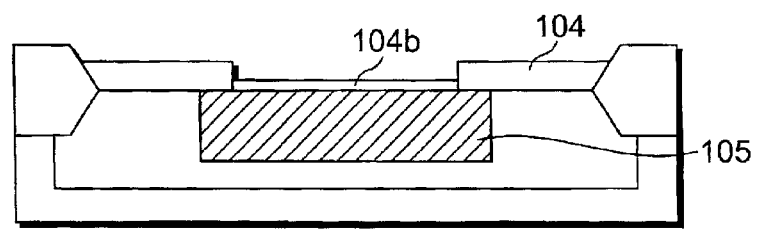
Figure 1C:
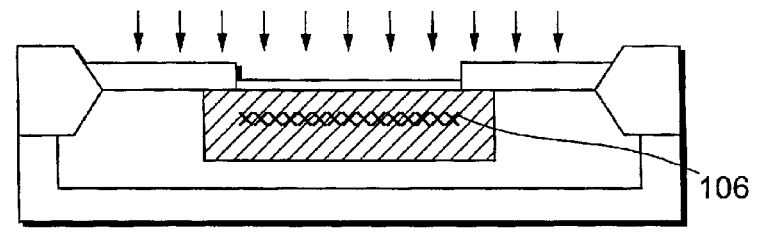
Figure 1D:
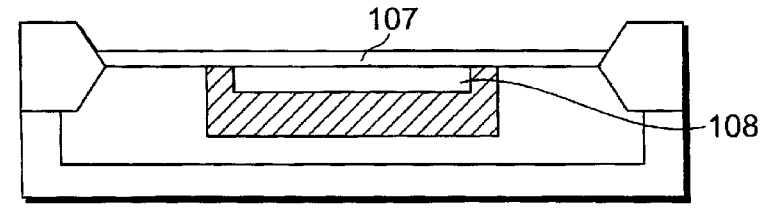
Figure 1E:
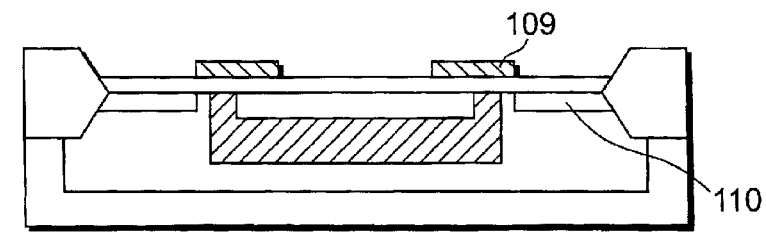
Figure 1F:
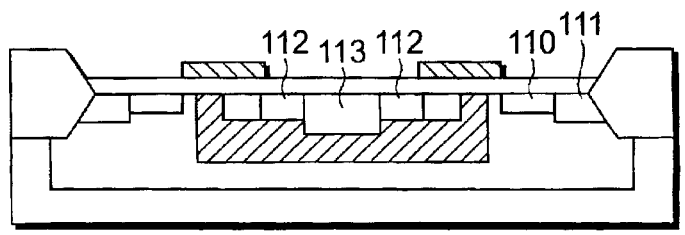

FIGS. 1(A) to 1(F) are diagrams showing a manufacturing method of a semiconductor device according to a first embodiment of the present invention. A first diffusion layer (well) 103 of a second conductivity type is formed on a portion of a semiconductor substrate 101 of a first conductivity type. A field oxide film 102 for isolating elements from one another can be formed using a known LOCOS forming technique, and a method similar to the conventional method can be used in a process for forming the first diffusion layer 103 of the second conductivity type. (FIG. 1(A)).

Subsequently, a first insulating film 104 is formed on the semiconductor substrate 101 of the first conductivity type, and a portion of the first insulating film 104 above the first diffusion layer 103 of the second conductivity type is opened (first opening). The first insulating film 104 is formed to a thickness of about 5000 angstroms by a known oxidation technique. A known photolithography/etching technique is used to open the first insulating film 104 in a region forming a D well, and a first insulating film 104b is formed in about 200 angstroms by the known oxidation technique.

Subsequently, a second diffusion layer (D well) 105 of the first conductivity type is formed in a portion in the first diffusion layer 103 of the second conductivity type via the first opening. The second diffusion layer 105 of the first conductivity type forming the D well is formed by implanting P-type impurities such as boron (B) by a known ion-implantation technique, and subsequently performing a heat treatment in an $N_2$ gas atmosphere at 1000° C. for about 20 minutes by a known diffusion technique. (FIG. 1(B))

Subsequently, an impurity 106 of the second conductivity type set to be introduced inwards via a main surface of the second diffusion layer 105 of the first conductivity type is introduced into the second diffusion layer 105 of the first conductivity type via the first opening (source). A known high-energy ion-implantation technique can be used in forming a source region, and the N-type impurity 106 such as arsenic (As) is implanted with an energy amount of 500 keV, and a dosage of about $5.0 \times 10^{15}/cm^2$. In this case, for an arsenic ion, a high-energy ion-implantation is set so that a stepped portion of an oxide film is not formed on the D well by the subsequent heat treatment during formation of a gate oxide film and the arsenic ion is diffused to the surface by the heat treatment. (FIG. 1(C)).

Subsequently, the first insulating film 104 is removed, a second insulating film (gate oxide film) 107 is formed on the semiconductor substrate 101 of the first conductivity type, and the impurity 106 of the second conductivity type is activated to form a third diffusion layer 108 of the second conductivity type. After the first insulating films 104, 104b are removed, the second insulating film 107 is formed in about 300 angstroms using the known oxidation technique. In this case, the impurity 106 of the second conductivity type introduced into the region forming the source is diffused to the surface, and the third diffusion layer 108 of the second conductivity type is formed (FIG. 1(D)).

Subsequently, a gate electrode material is formed on the second insulating film 107, and a gate electrode 109 of LDMOS is formed and extended from a partial region of the third diffusion layer 108 of the second conductivity type at least onto the region of the second diffusion layer 105 of the first conductivity type excluding the third diffusion layer 108 of the second conductivity type. For the gate electrode 109, for example, polysilicon is formed in a region forming a channel using the known CVD/photolithography/etching technique. A fourth diffusion layer (RSD) 110 of the second conductivity type is formed in a region excluding the second diffusion layer 105 of the first conductivity type in the first diffusion layer 103 of the second conductivity type. (FIG. 1(E)).

Subsequently, a fifth diffusion layer 111 of the second conductivity type is formed in a region on a side opposite to that of the second diffusion layer 105 of the first conductivity type via the fourth diffusion layer 110 of the second conductivity type in the first diffusion layer 103 of the second conductivity type. Additionally, a sixth diffusion layer 112 of the second conductivity type is formed in a portion in the third diffusion layer 108 of the second conductivity type.

Subsequently, the known photolithography technique is used to perform a desired patterning, and a resist and the gate electrode 109 are used as masks to implant N-type impurities such as phosphorus (P) into the surface in the first diffusion layer 103. The fourth diffusion layer 110 of the second conductivity type forming an RSD is formed by the known diffusion technique.

Subsequently, a seventh diffusion layer 113 of the first conductivity type is formed in a portion in the second diffusion layer 105 of the first conductivity type and connected to the second diffusion layer 105 of the first conductivity type. The known photolithography and implantation techniques are used to implant the N-type impurities such as arsenic (As) in a region from which electrodes of the drain and source are extracted with an energy amount of 60 keV, and a dosage of about $1.0 \times 10^{15}/cm^2$. The P-type impurities such as boron (B) are implanted in a region from which an electrode of the D well is extracted with an energy amount of 30 keV, and a dosage of about $1.0 \times 10^{15}/cm^2$. (FIG. 1(F)).

Finally, the known diffusion technique is used to form the fifth, sixth, and seventh diffusion layers 111, 112, 113. Finally, after a contact and wiring are formed, the LDMOS is formed. Additionally, a known technique is used in forming the contact and wiring (not shown).

A known semiconductor manufacturing technique can be used in respective processes such as photolithography, etching, deposition of various members, implantation, diffusion, contact formation, and wiring formation. This also applies to the following second embodiment of the present invention.

According to the first embodiment of the present invention, when the impurity of the second conductivity type forming the source region is implanted by high-energy ion-implantation, accelerated oxidation during formation of the gate oxide film can be suppressed, the stepped portion of the gate oxide film on the D well is reduced, and a highly-reliable semiconductor device can be provided.

Figure 2A:
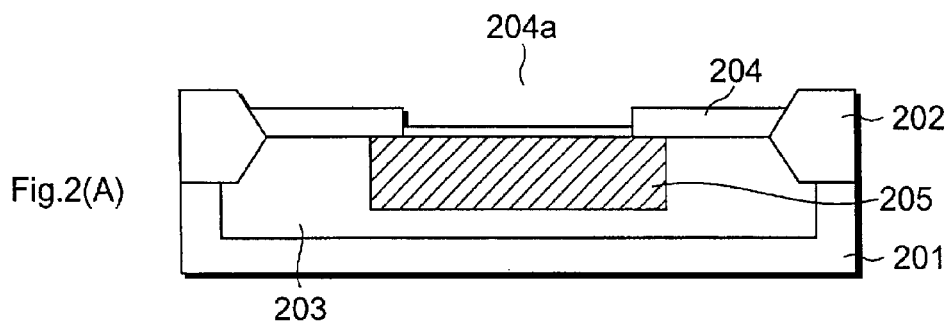
FIGS. 2(A) to 2(D) are transverse sectional front views showing the manufacturing process of the LDMOS transistor according to a second embodiment of the present invention.
Figure 2B:
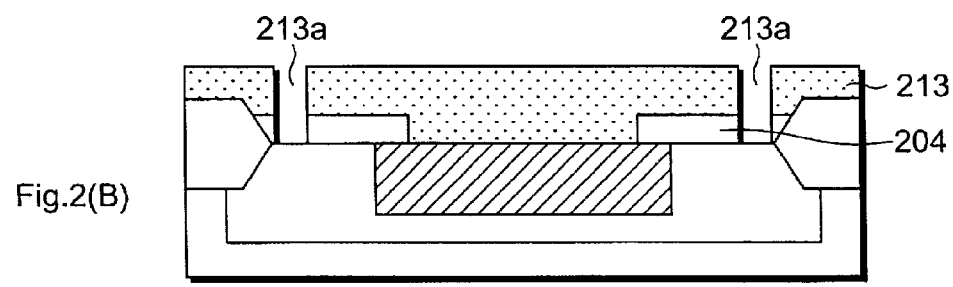
Figure 2C:
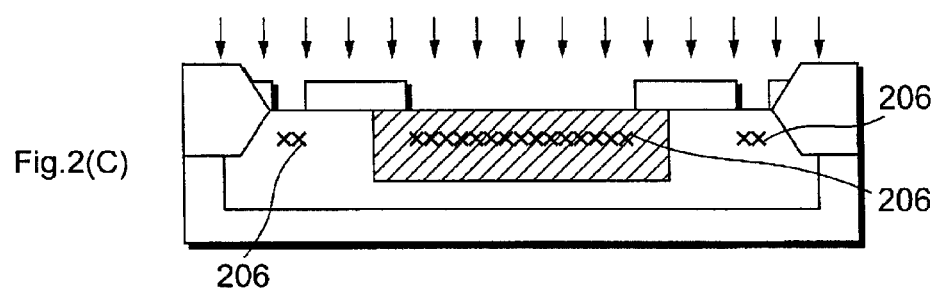
Figure 2D:
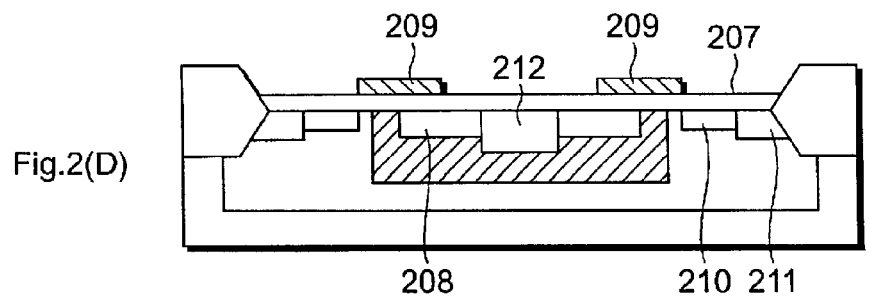

FIGS. 2(A) to 2(D) are process sectional views showing a second embodiment of the present invention.

First, a first diffusion layer (well) 203 of the second conductivity type is formed in a portion on a semiconductor substrate 201 of the first conductivity type. Next, a first insulating film 204 is formed on the semiconductor substrate 201 of the first conductivity type. A portion of the first insulating film 204 above the first diffusion layer 203 of the second conductivity type is opened, and a first opening 204 a is formed. (FIG. 2 (A)) A second diffusion layer (D well) 205 of the first conductivity type is formed in a portion in the first diffusion layer 203 of the second conductivity type via the first opening 204a. (FIG. 2 (A)).

Subsequently, by the known photolithography and etching techniques, a resist 213 is formed, and in the first insulating film 204, an opening 213a is formed as a region from which the drain electrode and source electrode of the LDMOS are extracted in a part of a region in which the second diffusion layer 205 of the first conductivity type is not formed in the first diffusion layer 203 of the second conductivity type. The resist 213 is removed, and an impurity 206 of the second conductivity type set to be introduced inwards from a main surface of the semiconductor substrate 201 of the first conductivity type and the second diffusion layer 205 of the first conductivity type simultaneously via the second and first openings, so that the source and drain are formed. (FIG. 2(B)).

Here, by the known high-energy ion-implantation technique, the N-type impurities such as arsenic (As) are implanted with an energy amount of 500 keV, and a dosage of about $5.0 \times 10^{15}/cm^2$. In this case, for the implanted arsenic ion, the high-energy ion-implantation is set so that the stepped portion of the oxide film on the D well is not formed by the subsequent heat treatment during formation of a gate oxide film 207, and the arsenic ion is diffused to the surface by the heat treatment. (FIG. 2(C)).

Subsequently, the first insulating film 204 is removed, the second insulating film (gate oxide film) 207 is formed on the semiconductor substrate 201 of the first conductivity type, and the impurity 206 of the second conductivity type is activated to form a third diffusion layer 208 of the second conductivity type.

Subsequently, the gate electrode material is formed on the second insulating film 207, and a gate electrode 209 of LDMOS is formed and extended from a partial region of the third diffusion layer 208 of the second conductivity type at least onto the region of the second diffusion layer 205 of the first conductivity type excluding the third diffusion layer 208 of the second conductivity type. Subsequently, a fourth diffusion layer (RSD) 210 of the second conductivity type is formed in a region excluding the second diffusion layer 205 of the first conductivity type in the first diffusion layer 203 of the second conductivity type.

Subsequently, a fifth diffusion layer 211 in first diffusion layer 203, and a sixth diffusion layer 212 of the first conductivity type is formed in a portion in the second diffusion layer 205 of the first conductivity type and connected to the second diffusion layer 205 of the first conductivity type. (FIG. 2 (D)).

According to the second embodiment of the present invention, in addition to an effect of the first embodiment, there is an effect that the introduction of the impurity of the second conductivity type for forming the source region and the introduction of the impurity of the second conductivity type for extracting the drain and source electrodes are simultaneously performed, and an ion-implantation process can therefore be reduced.

The preferred embodiments of the manufacturing method of the LDMOS transistor according to the present invention have been described above with reference to the accompanying drawings, but the present invention is not limited to these embodiments. A person skilled in the art would apparently develop various modifications within a category of technical thoughts defined by the appended claims, and such modifications are also deemed to be naturally within the technical scope of the present invention.

As described above, according to the present invention, there can be provided a highly reliable LDMOS transistor in which accelerated oxidation during formation of the gate oxide film can be suppressed and therefore the stepped portion of the gate oxide film on the D well is reduced.

What is claimed is:

1. A method of manufacturing an LDMOS transistor comprising:
    providing a semiconductor substrate of a first conductivity type having a well region of a second conductivity type formed on a surface thereof;
    implanting ions of the first conductivity type into a part of the well region;
    forming a gate oxide layer on the surface of the semiconductor substrate,
    said forming the gate oxide layer including subjecting the semiconductor substrate to a heat treatment so that the implanted ions are diffused to form a diffusion region of the first conductivity type on the surface of the semiconductor substrate;
    forming a gate electrode on the surface of the semiconductor substrate; and
    forming a drain region on the surface of the semiconductor substrate,
    wherein said implanting ions is carried out with an energy set so that an accelerated oxidation during said forming the gate oxide layer is inhibited.

2. A method of manufacturing an LDMOS transistor according to claim 1, wherein said implantation is conducted as a high energy ion implantation with an energy amount that is about 500 keV.

3. A method of manufacturing an LDMOS transistor according to claim 1, wherein said implantation is conducted with a dosage of about $5.0 \times 10^{15}/cm^2$.

4. A method of manufacturing an LDMOS transistor according to claim 1, wherein said implantation is conducted into a region of the semiconductor substrate where the drain region is formed.

5. A method of manufacturing an LDMOS transistor according to claim 1, wherein the drain region is a reduced surface drain.

6. A method of manufacturing an LDMOS transistor comprising:
    providing a semiconductor substrate of a first conductivity type having a first well region of a second conductivity type formed on a surface thereof, and a second well region of the first conductivity type formed within the first well region;
    implanting ions of the second conductivity type into a part of the second well region;
    forming a gate oxide layer on the surface of the semiconductor substrate,
    said forming the gate oxide layer including subjecting the semiconductor substrate to a heat treatment so that the implanted ions are diffused to form a diffusion region of the second conductivity type on the surface of the semiconductor substrate within the second well region;
    forming a gate electrode on the surface of the semiconductor substrate; and
    forming a drain region on the surface of the semiconductor substrate,
    wherein said implanting ions is carried out with an energy set so that an accelerated oxidation during said forming the gate oxide layer is inhibited.

7. A method of manufacturing an LDMOS transistor according to claim 6, wherein said implantation is conducted as a high energy ion implantation with an energy amount that is about 500 keV.

8. A method of manufacturing an LDMOS transistor according to claim 6, wherein said implantation is conducted with a dosage of about $5.0 \times 10^{15}/cm^2$.

9. A method of manufacturing an LDMOS transistor according to claim 6, wherein said implantation is conducted into a region of the semiconductor substrate where the drain region is formed.

10. A method of manufacturing an LDMOS transistor according to claim 6, wherein the drain region is a reduced surface drain.

11. A method of manufacturing an LDMOS transistor comprising:
    providing a semiconductor substrate of a first conductivity type having a first well of a second conductivity type formed on a surface thereof within a first region, and a second well of the first conductivity type formed within a second region that is inside of the first region;
    implanting ions of the second conductivity type into the second well;
    forming a gate oxide layer on the surface of the semiconductor substrate,
    said forming the gate oxide layer including subjecting the semiconductor substrate to a heat treatment so that the implanted ions are diffused to form a diffusion region of the second conductivity type located in a third region that is inside of the second region;
    forming a gate electrode on the surface of the semiconductor substrate, the gate electrode extending from the first region to the third region through the second region; and
    forming a drain region on the surface of the semiconductor substrate within the first region, wherein said implanting ions is carried out with an energy set so that an accelerated oxidation during said forming the gate oxide layer is inhibited.

12. A method of manufacturing an LDMOS transistor according to claim 11, wherein said implantation is conducted as a high energy ion implantation with an energy amount that is about 500 keV.

13. A method of manufacturing an LDMOS transistor according to claim 11, wherein said implantation is conducted with a dosage of about $5.0 \times 10^{15}/cm^2$.

14. A method of manufacturing an LDMOS transistor according to claim 11, wherein said implantation is conducted into a region of the semiconductor substrate where the drain region is formed.

15. A method of manufacturing an LDMOS transistor according to claim 11, wherein the drain region is a reduced surface drain.

16. A method of manufacturing an LDMOS transistor comprising:

providing a semiconductor substrate of a first conductivity type having a first well region of a second conductivity type formed therein and a second well region of the first conductivity type formed in the first well region;

implanting ions of the second conductivity type into a part of the second well region;

forming a gate oxide layer on a surface of the semiconductor substrate, said forming the gate oxide layer including subjecting the semiconductor substrate to a heat treatment so that the implanted ions are diffused to form a diffusion region of the second conductivity type on the surface of the semiconductor substrate as a source region;

forming a gate electrode extending from a part of the source region to a part of the second well region excluding the source region; and forming a drain region on the surface of the semiconductor substrate at an area excluding the second well region by using a resist layer and the gate electrode as a mask, wherein said implanting ions is carried out with an energy set so that an accelerated oxidation during said forming a gate oxide layer is inhibited, and so that the impurity ions of the second conductivity type are diffused into the surface of the semiconductor substrate due to the heat treatment.

* * * * *